(12) United States Patent
Ejury et al.

(10) Patent No.: US 9,559,613 B2
(45) Date of Patent: Jan. 31, 2017

(54) SYSTEM AND METHOD FOR A SWITCH DRIVER

(71) Applicant: Infineon Technologies AG, Neubiberg (DE)

(72) Inventors: Jens Ejury, Fremont, CA (US);
Giuseppe Bernacchia, Porcia (IT);
Henrik Hassander, Villach (DE)

(73) Assignee: Infineon Technologies AG, Neubiberg (DE)

( * ) Notice: Subject to any disclaimer, the term of this patent is extended or adjusted under 35 U.S.C. 154(b) by 136 days.

(21) Appl. No.: 14/469,045

(22) Filed: Aug. 26, 2014

(65) Prior Publication Data
US 2015/0077081 A1    Mar. 19, 2015

Related U.S. Application Data

(60) Provisional application No. 61/879,515, filed on Sep. 18, 2013.

(51) Int. Cl.
| | | |
|---|---|---|
| *H02M 3/156* | (2006.01) | |
| *H02M 7/538* | (2007.01) | |
| *H03K 3/0231* | (2006.01) | |

(52) U.S. Cl.
CPC .......... *H02M 7/538* (2013.01); *H03K 3/0231* (2013.01); *H02M 3/156* (2013.01)

(58) Field of Classification Search
CPC ........ H02M 7/538; H02M 1/08; H02M 3/156; H02M 1/00; H02H 3/24; H03K 3/0231
USPC ................................................ 323/282, 284
See application file for complete search history.

(56) References Cited

U.S. PATENT DOCUMENTS

| | | | | |
|---|---|---|---|---|
| 8,901,912 | B2* | 12/2014 | Lee .......................... | G05F 1/468 323/242 |
| 2008/0218141 | A1* | 9/2008 | Lu ....................... | H03K 17/6871 323/282 |
| 2010/0289560 | A1 | 11/2010 | Mavencamp et al. | |
| 2013/0241621 | A1* | 9/2013 | Forghani-Zadeh ........................ | H03K 17/08122 327/315 |
| 2014/0062431 | A1* | 3/2014 | Yanase ...................... | G05F 1/46 323/271 |
| 2014/0183975 | A1 | 7/2014 | Wu | |

FOREIGN PATENT DOCUMENTS

| | | |
|---|---|---|
| CN | 101312328 A | 11/2008 |
| CN | 103023286 A | 4/2013 |

(Continued)

*Primary Examiner* — Jessica Han
*Assistant Examiner* — Lorena Bruner
(74) *Attorney, Agent, or Firm* — Slater Matsil, LLP

(57) ABSTRACT

In accordance with an embodiment, switch driver includes a first switch driver configured to be coupled to a control node of a first switch, a second driver configured to be coupled to a control node of a second switch, and a first terminal and a second terminal configured to be couple to a boot capacitor. The first terminal is coupled between a boot input of the first switch driver and the second terminal is configured to be coupled to outputs of the first switch and the second switch. The switch driver further includes a voltage measurement circuit coupled to the first terminal and the second terminal, and a control circuit configured to activate the second switch driver when the voltage measurement circuit indicates that a voltage across boot capacitor is below a first threshold.

20 Claims, 14 Drawing Sheets

(56) References Cited

FOREIGN PATENT DOCUMENTS

| JP | 2007195361 A | 8/2007 |
|---|---|---|
| JP | 2012182884 A | 9/2012 |
| JP | 2013085419 A | 5/2013 |

* cited by examiner

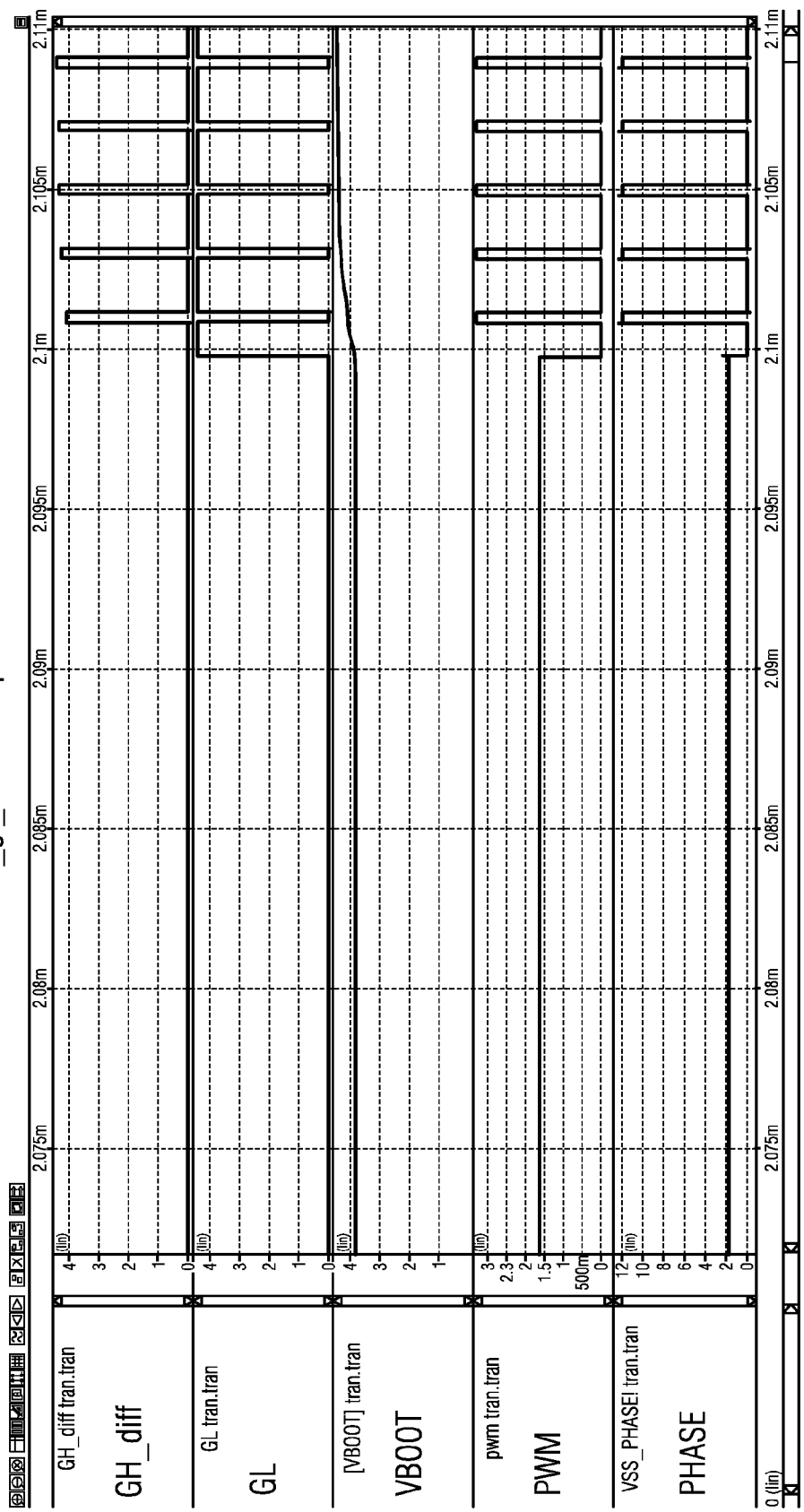

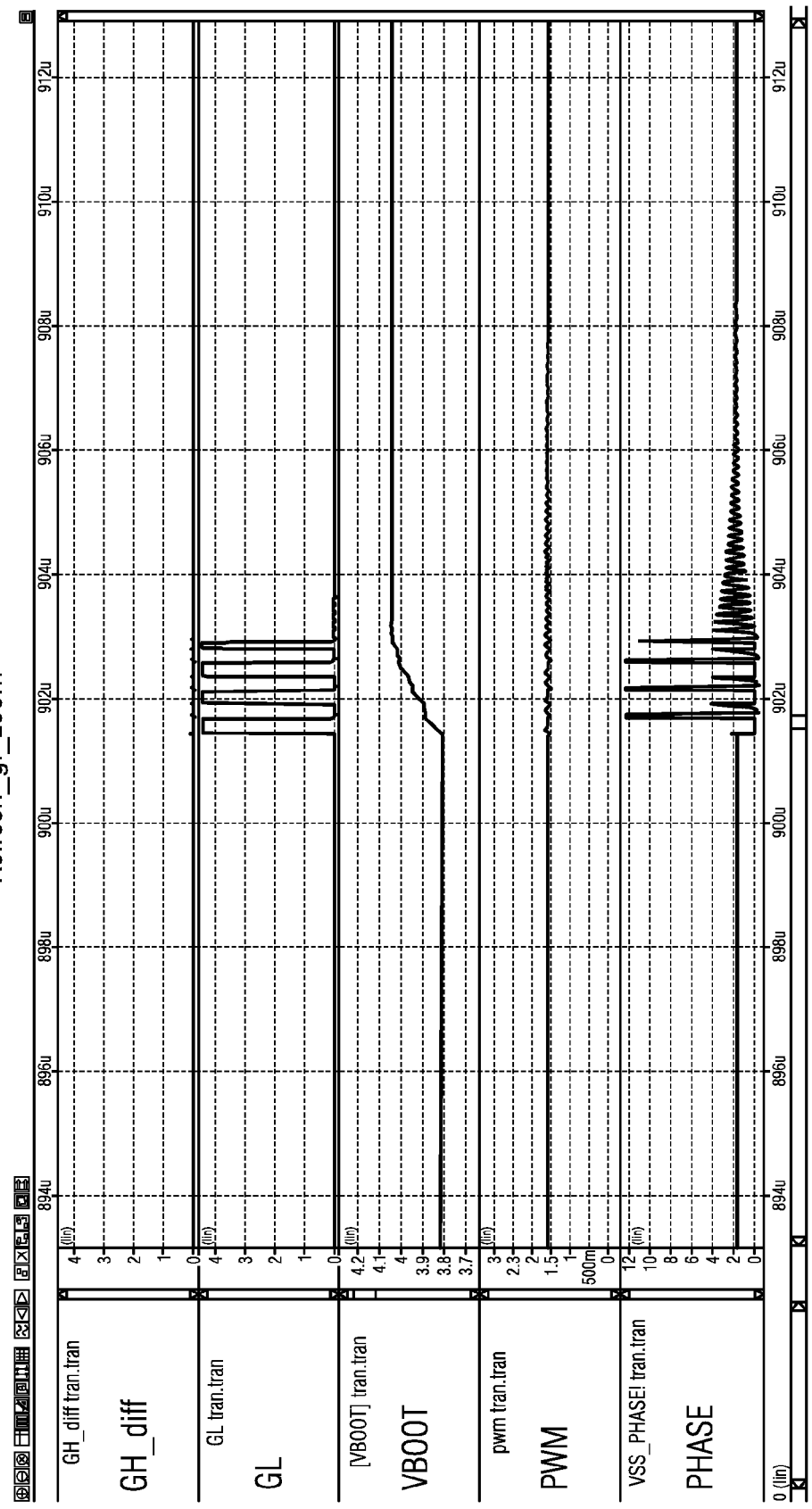

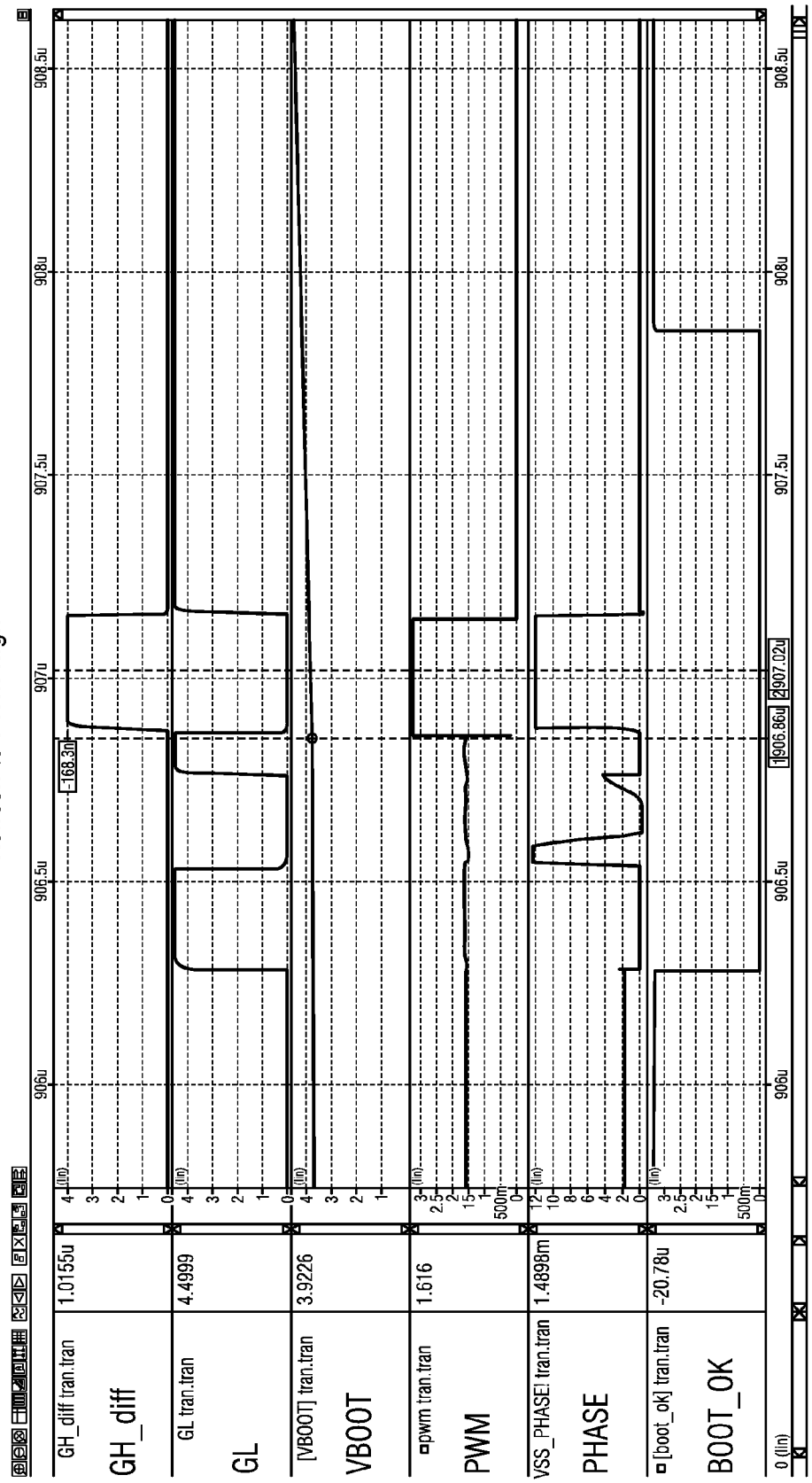

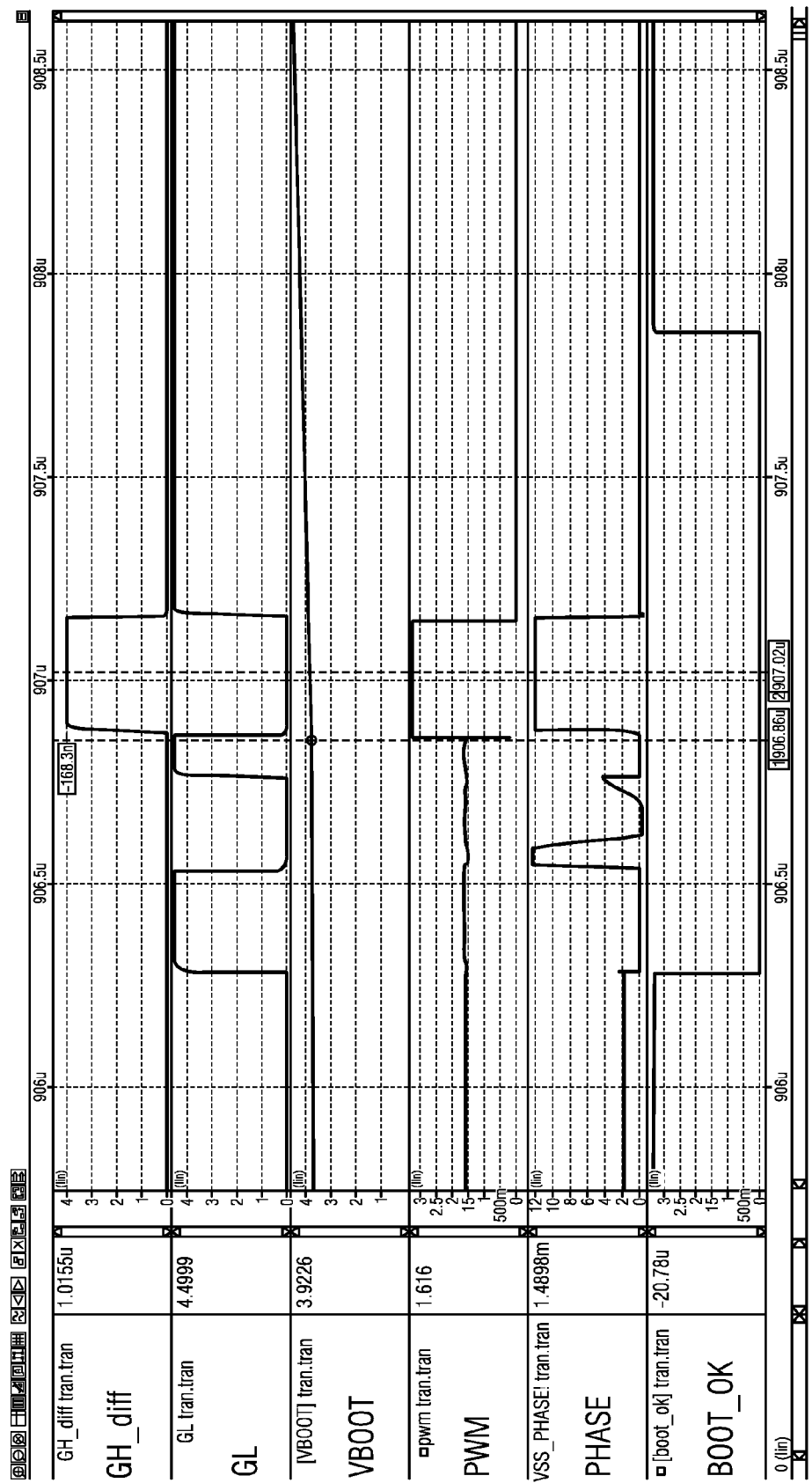

SYSTEM AND METHOD FOR A SWITCH DRIVER

This patent application claims priority to U.S. Provisional Application No. 61/879,515, filed on Sep. 18, 2013 and entitled "System and Method for a Switch Driver," which application is hereby incorporated by reference herein in its entirety.

TECHNICAL FIELD

The present disclosure relates generally to an electronic device, and more particularly to a system and method for a switch driver.

BACKGROUND

Power supply systems are pervasive in many electronic applications from computers to automobiles. Generally, voltages within a power supply system are produced by performing a DC/DC, a DC/AC, and/or an AC/DC conversion by operating a switch loaded with an inductor or transformer. DC-DC converters, such as buck converters, are used in systems that use multiple power supplies. For example, in an automotive system, a microcontroller that nominally operates at a 5V power supply voltage may use a switched-mode power supply, such as a buck converter to produce a local 5V power supply from the 12V car battery. Such a power supply may be operated by driving an inductor using a high-side switching transistor coupled to a DC power supply. The output voltage of the power supply is controlled by varying the pulse-width of the time during which the switching transistor is in a conductive state.

Important considerations in the design of switched-mode power converters include the reliability and efficiency of the power supply system. Power may be lost during operation of the switched mode power supply, for example, due to transistor switching losses, the on-resistance of switching transistors, series resistance of passive devices, and resistive losses in wiring and interconnect. Such losses not only degrades the efficiency of the power supply system, but may also cause heat dissipation that can stress the various components on the power supply and/or create thermal stress to other circuits and components in the vicinity of the switched mode power supply.

SUMMARY OF THE INVENTION

In accordance with an embodiment, switch driver includes a first switch driver configured to be coupled to a control node of a first switch, a second driver configured to be coupled to a control node of a second switch, and a first terminal and a second terminal configured to be couple to a boot capacitor. The first terminal is coupled between a boot input of the first switch driver and the second terminal is configured to be coupled to outputs of the first switch and the second switch. The switch driver further includes a voltage measurement circuit coupled to the first terminal and the second terminal, and a control circuit configured to activate the second switch driver when the voltage measurement circuit indicates that a voltage across boot capacitor is below a first threshold.

BRIEF DESCRIPTION OF THE DRAWINGS

For a more complete understanding of the present invention, and the advantages thereof, reference is now made to the following descriptions taken in conjunction with the accompanying drawings, in which:

FIGS. 7a-7e illustrate waveform diagrams showing various operation scenarios of embodiment systems.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a switched-mode power supply system. Embodiments of the present invention may also be applied to other systems and applications including other circuits that utilize boosted switch drivers such as general power supply systems, motor control systems, power distribution system, lighting system, and other circuits. Embodiments of the present invention may also be applied to the generation of switching signals multiphase power converters, as well as the generation of switching signals for charge pumps.

Figure 1:
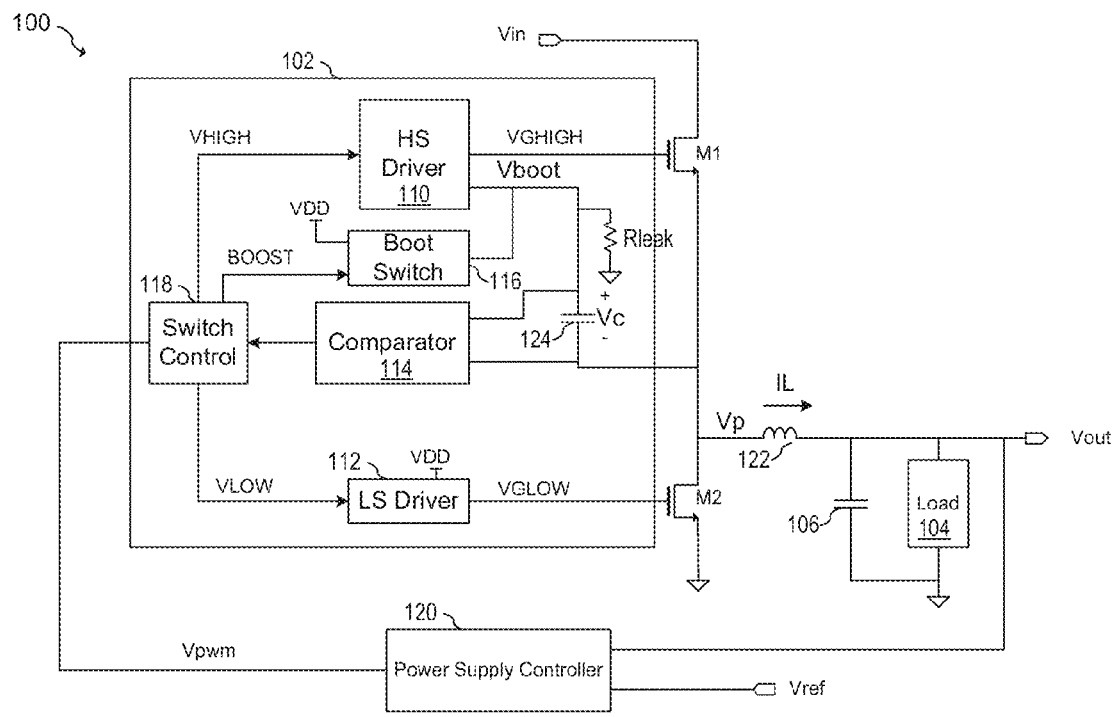
FIG. 1 illustrates an embodiment buck converter.

FIG. 1 illustrates switched-mode power supply system 100 according to an embodiment of the present invention. As shown, switched-mode power supply system 100 is configured as a buck converter. During operation, an external DC voltage is applied to node Vin coupled to the drain of high side switching transistor M1. By periodically switching high side switching transistor M1 and low side switching transistor M2, inductor current IL is caused to flow through inductor 122 and power load 104. Since switched-mode power supply system 100 is configured as a buck converter, the DC voltage at node Vout may be lower than the applied voltage at node Vin. By minimizing losses though high side switching transistor M1 and low side switching transistor M2, thermal transients may be prevented and the reliability of high side switching transistor M1 and low side switching transistor M2 may be maintained. In addition, the efficiency of switched-mode power supply system 100 may be kept high.

One way to minimize losses through high side switching transistor M1 and low side switching transistor M2 is to drive the gates of high side switching transistor M1 and low side switching transistor M2 so that transistors M1 and M2 operate reliably within the ohmic region. With respect to low side switching transistor M2, this may be achieved by applying, for example, power supply voltage VDD to the gate of transistor M2. With respect to high side switching transistor M1, however, high side switch driving signal VGHIGH will exceed input voltage VIN in order to keep transistor M1 well enhanced. In an embodiment, boot capacitor 124 is used to boost the gate of high side switching transistor M1.

In some situations, for example, at very low operating frequencies or times during which high side switching transistor M1 and low side switching transistor M2 are kept in a high impedance state, the boot capacitor 124 may be discharged through parasitic leakage paths that are represented by leakage resistance Rleak. If boot capacitor 124 becomes discharged, however, the ability of boot capacitor 124 to boost the gate voltage of high side switching transistor M1 because degraded, thereby increasing the on resistance of transistor M1 and potentially increasing the power dissipation of transistor M1. In an embodiment of the present invention, voltage Vc across boot capacitor 124 is monitored. If the voltage Vc falls below a predetermined threshold, transistor M2 is activated for a series of short pulses until boot capacitor 124 is recharged, thereby allowing for the on on-state-resistance of high side switching transistor M1 to be low even after a sustained period of non-operation.

Switched-mode power supply system 100 includes switch driver 102 coupled to high side switching transistor M1 and low side switching transistor M2, which are driven by switch control circuit 118. High side driver 110 and low side driver 112 may be implemented using high and low side driver circuits known in the art. While switched-mode power supply system 100 is configured as a buck converter, in alternative embodiments, switched-mode power supply system 100 may be configured as a boost converter or as another switched mode power supply topology. High side switching transistor M1 and low side switching transistor M2 are coupled to load 104 via inductor 122. A power supply controller 120 may monitor output voltage Vout and derive a pulse width modulated (PWM) or pulse frequency modulated (PFM) signal Vpwm. The frequency of Vpwm may be between about 250 kHz and 2 MHz.; however frequencies outside of this range may also be used. In some embodiments, the pulse width and/or frequency of Vpwm may be dependent on a voltage difference between output voltage Vout and voltage Vref.

In an embodiment, boot capacitor 124 is used to provide a boosted drive voltage to high side switching transistor M1. In such a case, when low side switching transistor M2 is turned on and high side switching transistor M1 is turned off, node Vp is pulled to ground and power supply voltage VDD is applied to boot capacitor 124 via node Vboot. In some embodiments, VDD is applied to boot capacitor 124 via boot switch 116, which may be implemented, for example, using a switch, a diode, or other circuit known in the art.

In FIG. 1, high side switching transistor M1 and low side switching transistor M2 are shown as being NMOS devices. It should be understood, however, that other device types may be used to implement the high and low side switching transistors. For example, PMOS devices, BJT devices, JFET devices, power MOSFETs, and other devices types may be used as well as combinations thereof. In such embodiments, the polarity and signal strengths of the respective driver, input and output voltage, control signals may be adjusted accordingly.

During operation, boot capacitor 124 is charged to power supply voltage VDD. Next, when low side switching transistor M2 is shut off and high side switching transistor M1 is turned on, the rising voltage of Vp forces the voltage of node Vboot to increase higher than power supply voltage VDD. High side driver 110 uses voltage Vboot to derive high side switch driving signal VGHIGH such that high side switching transistor M1 is fully turned on. In other words, boot capacitor 124 is used to bootstrap the gate of high side switching transistor M1. By boosting high side switch driving signal VGHIGH at the gate of high side switching transistor M1, high side switching transistor M1 may be fully turned on to reduce its series resistance.

In some modes of operation, for example, in cases where the duty cycle of Vpwm is very low, or in some forms of burst mode operation, high side switching transistor M1 and low side switching transistor M2 may be turned off for extended periods of time. During these extended periods of time when high side switching transistor M1 and low side switching transistor M2 are not being switched, boot capacitor 124 may be discharged via one or more parasitic leakage paths represented as leakage resistance Rleak. In some cases, the longer the time that boot capacitor 124 has to discharge, the lower the boosted drive available to high side switching transistor M1 when it is finally activated. In some cases, if boot capacitor 124 is sufficiently discharged, then high side switching transistor M1 may initially operate in the linear region or may not turn on at all. The increased series resistance of high side switching transistor M1 due to linear mode operation may cause excessive power dissipation and may affect the reliability of the switched-mode power supply system 100.

In some conventional systems, high side switch driving signal VGHIGH may be inhibited for one or more switching cycles after a period of activity in order to allow boot capacitor 124 to recharge. For example, the first cycle of high side switch driving signal VGHIGH may be disabled so that high side switching transistor M1 is activated prior to low side switching transistor M2 being activated, thereby allowing boot capacitor 124 to be fully charged. Using such a method, however, may cause current inductor current IL to initially reverse it polarity.

In an embodiment of the present invention, voltage Vc across boot capacitor 124 is monitored by comparator 114. When voltage Vc falls below a predetermined threshold, switch control circuit 118 periodically activates low side switching transistor M2 for short periods of time. For example, in one example, low side switching transistor M2 may be activated for a pulse width of about 100 ns every 300 ns until boot capacitor 124 is recharged. By making the pulse width of M2 short compared to the pulse width of the signal Vpwm, boot capacitor 124 may be recharged without significantly affecting inductor current IL.

Figure 2:
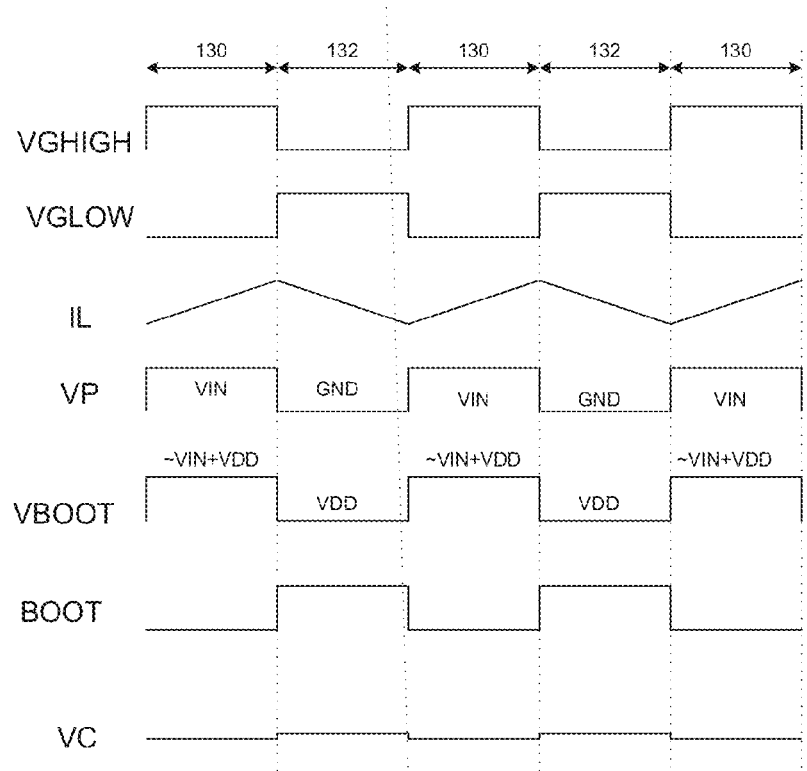
FIG. 2 illustrates a waveform diagram of an embodiment buck converter.

FIG. 2 shows a waveform diagram that illustrates the operation of switched-mode power supply system 100. During time period 130, high side switching transistor M1 is activated by high side driver 110 via high side switch driving signal VGHIGH, thereby coupling input voltage Vin to node Vp. During time period 130, inductor 122 is charged, as shown by increasing inductor current IL. Next, during time period 132, high side switch driving signal VGHIGH is deactivated and low side switch driving signal VGLOW is subsequently activated, thereby coupling node Vp to ground and discharging inductor current IL, as evidenced by decreasing inductor current IL. In some embodiments, switched-mode power supply system 100 may operate in a continuous conduction mode (CCM) in which low side driver 112 is either being charged and discharged such that inductor current IL is always of one polarity. In other embodiments, switched-mode power supply system 100 may also or alternatively operate in a discontinuous conduction mode (DCM) in which the both high side switching transistor M1 and low side switching transistor M2 are shut off for a period of time to prevent the polarity of inductor current IL from changing. In some cases, switched-mode power supply system 100 may operate in CCM during high load conditions and in DCM during lightly loaded conditions.

During time period 132, voltage VBOOT may be set to supply voltage VDD while node Vp is grounded. Thus, during next time period 130, voltage VBOOT is boosted, for example, to about VIN+VDD as the voltage at node Vp is pulled to voltage VIN via high side switching transistor M1. In embodiment in which boot switch 116 is implemented as a switch, boot control signal BOOT is high during time period 132 in order to charge boot capacitor 124, and low during time period 130, for example, to disconnect VDD from node Vboot.

As shown, during time period 132, voltage Vc across boot capacitor 124 is about VDD, while during time period 130, voltage Vc may slightly decrease.

Figure 3:
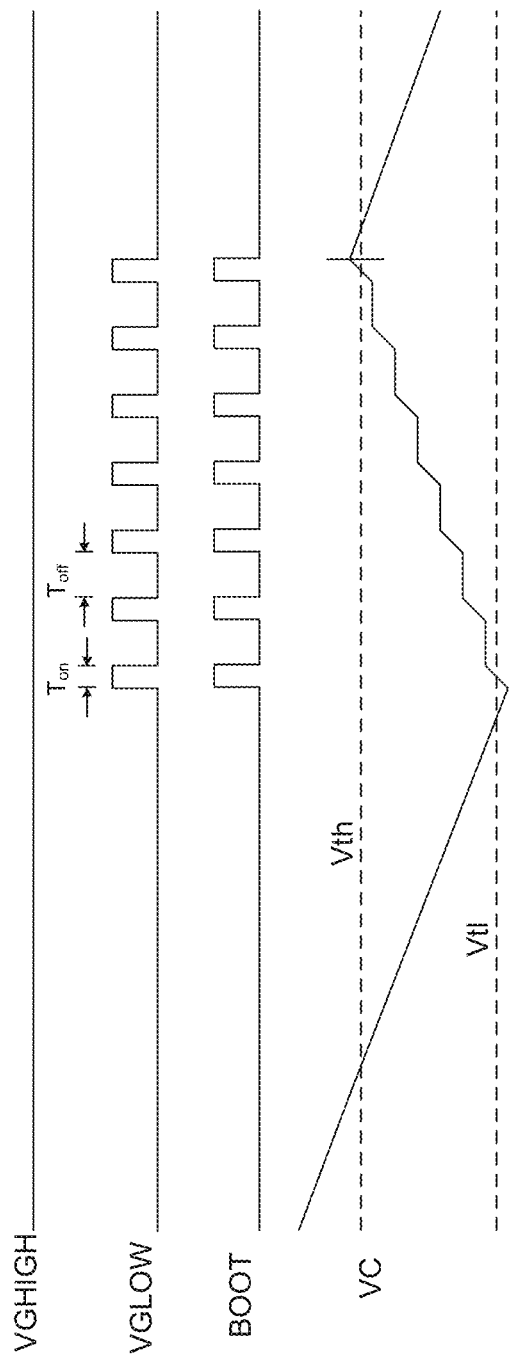
FIG. 3 illustrates a further embodiment timing diagram.

FIG. 3 illustrates a waveform diagram that shows the operation of switched-mode power supply system 100 during times that high side switching transistor M1 and low side switching transistor M2 are designated to be deactivated. As shown, both high side switch driving signal VGHIGH and low side switch driving signal VGLOW are initially low, thereby placing high side switching transistor M1 and low side switching transistor M2 in a high impedance state. In some embodiments, this effectively tri-states the output of the switching transistors. In this state, voltage Vc across boot capacitor 124 is decreases due to one or more parasitic discharge paths represented by leakage resistance Rleak in FIG. 1.

In an embodiment, once voltage Vc decreases below turn-on threshold Vtl, low side switching transistor M2 is periodically activated via low side switch driving signal VGLOW while high side switching transistor M1 remains off. In embodiments in which boot switch 116 is implemented using a switch, boot switch control voltage BOOT is also asserted during these pulsed periods. Low side switch driving signal VGLOW continues to be pulsed until voltage Vc exceeds turn-off threshold Vth. In one example, turn-on threshold Vtl is set to about 3.7 V and turn-off threshold Vth is set to about 3.9 V. Alternatively, other voltages may be used depending on the particular embodiment and its particular requirements. By making turn-off threshold Vth and turn-on threshold Vtl different, hysteresis may be applied to the pulsing of low side switch driving signal VGLOW. In some embodiments, turn-off threshold Vth and turn-on threshold Vtl may be the same.

In an embodiment, low side switch driving signal VGLOW is turned on for a period of $T_{on}$ and turned off for a period of $T_{off}$. In some embodiments, $T_{on}$ may have a pulse width of between about 50 ns and 300 ns, and $T_{off}$ may between about 200 ns and about 500 ns. In alternative embodiments of the present invention, $T_{on}$ and $T_{off}$ may take on values outside of these ranges. In some embodiments, $T_{on}$ is between less than a fraction of a nominal pulse width used by the power supply. In some embodiments, this faction may be between about one 1/50 and about 1/10 the nominal pulse width of the power supply.

Figure 4A:
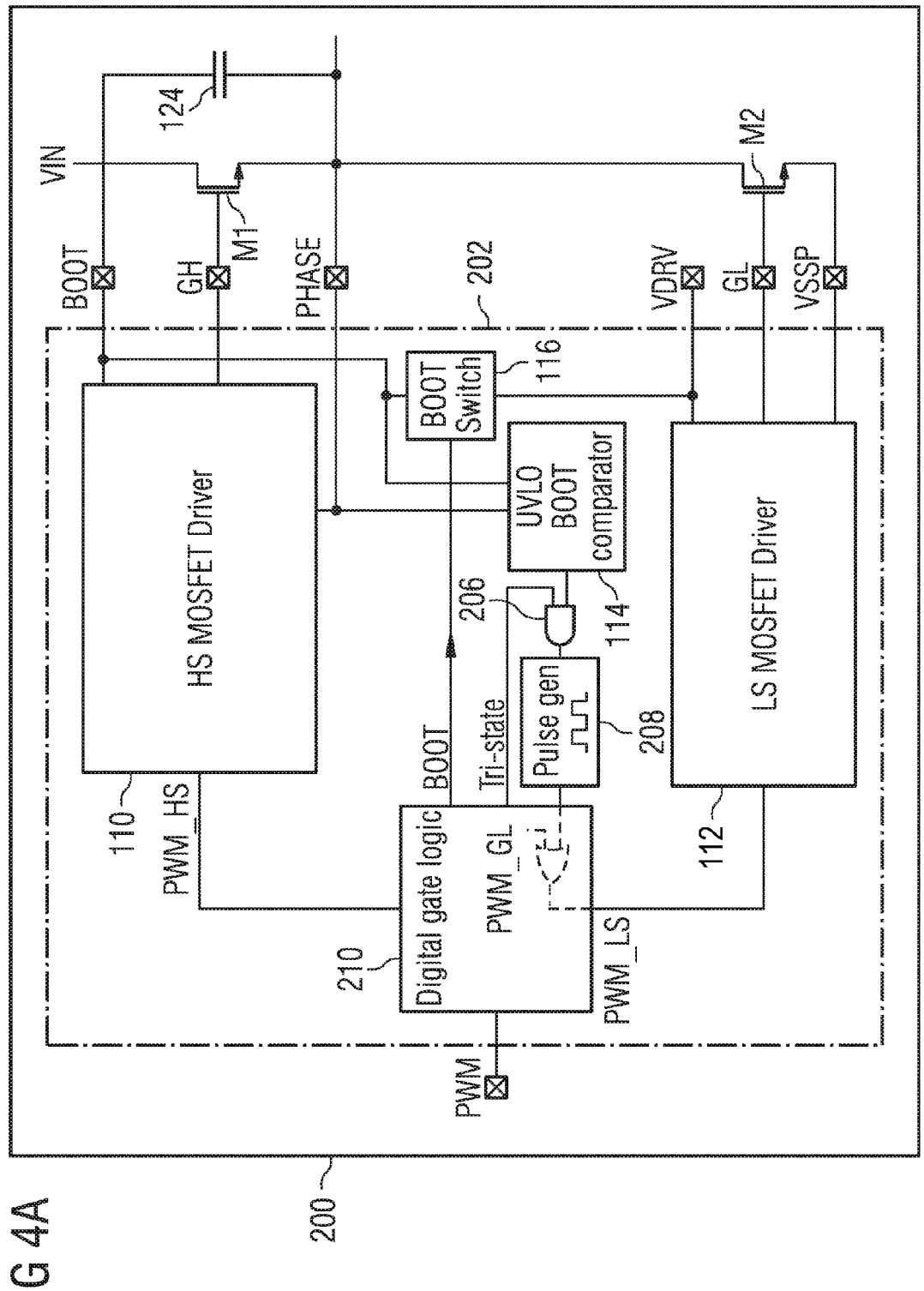
FIGS. 4a-4d illustrate embodiment switching systems.

FIG. 4a illustrates switching system 200 according to an embodiment of the present invention. As shown, the output of comparator 114 is coupled to pulse generator 208. In some embodiments, pulse generator 208 is configured to generate a pulse train independent of the state of input signal PWM. Pulse generator 208 may be implemented using counters, for example if a local or external clock or oscillator signal is available. Pulse generator 208 may also be implemented using a ring oscillator, a multi vibrator circuit, or other pulse generation circuits known in the art. In some embodiments, the pulse width, duty cycle, and/or pulse may be programmable using, for example, a digital interface (not shown). In an embodiment, logic gate 206 is disposed between the output of comparator 114 and the input of pulse generator 208. In one example, logic gate 206 is an AND gate and is used to activate pulse generator 208 when signal Tri-state is high, In an embodiment, signal Tri-state is activated by digital gate logic 210 when both high side switching transistor M1 and low side switching transistor M2 are designated to be OFF.

Digital gate logic 210 generates the control signals PWM_HS and PWM_LS that activate high side driver 110 and low side driver 112, respectively based on the state of input signal PWM. Digital gate logic 210 also provides an interface between pulse generator 208 and high side driver 110 low side driver 112. For example, when pulse generator 208 is activated, the resulting pulse train is used to activate signal BOOT that activates boot switch 116, and is used to activate low side switch input signal PWM_LS that activates low side switching transistor M2 via low side 112. Digital gate logic 210 may be implemented using digital logic circuits and methods known in the art. For example, digital gate logic 210 may be implemented using custom gate logic, standard cell logic, programmable logic, or other types of logic.

Figure 4B:
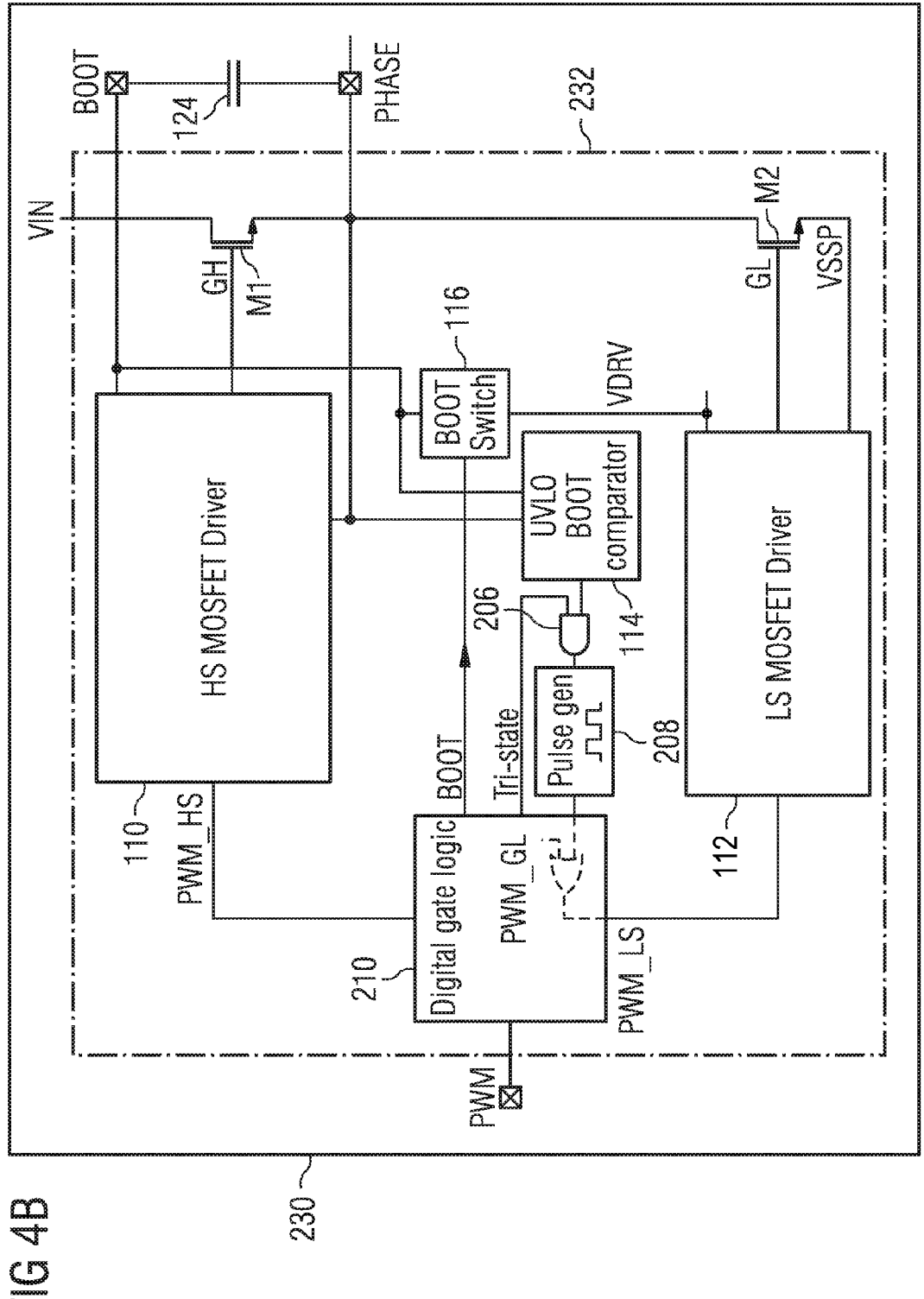

In an embodiment, driving circuit 202 that may be implemented, for example on a single integrated circuit having pins PWM configured to be coupled to an input PWM signal, BOOT configured to be coupled to a first terminal of boot capacitor 124, GH configured to be couple to the gate of high side switching transistor M1, PHASE configured to be coupled to the outputs of switching transistors M1 and M2, VDRV configured to be coupled to a power supply, GL configured to be coupled to the gate of low side switching transistor M2, and VSSP configured to be coupled to a reference node, such as ground. In some embodiments, switching system 200 may be implemented within a signal packaged part that includes driving circuit 202 on a first semiconductor die, high side switching transistor M1 on a second semiconductor die and low side switching transistor M2 on a third semiconductor die disposed upon a substrate. Boot capacitor 124 and/or other circuitry may be disposed in or on the substrate. In alternative embodiments, switching system 200 may be disposed on a single integrated circuit. In further embodiments, other system partitioning may be used. For example, switching transistors M1 and M2 may be disposed on the same integrated circuit as driving circuit 202, while boot capacitor 124 is externally coupled to the integrated circuit 232 as shown in FIG. 4b with respect to system 230. It should be understood that any of the embodiments disclosed herein may be partitioned with external switching transistors or switching transistors disposed on a same ,integrated circuit as the corresponding control and/or driving circuits. In further embodiments, one or more of pulse generator 208, logic gate 206 and UVLO boot comparator 114 may also be partitioned either on the same integrated circuit 232 or external to integrated circuit 232.

Figure 4C:
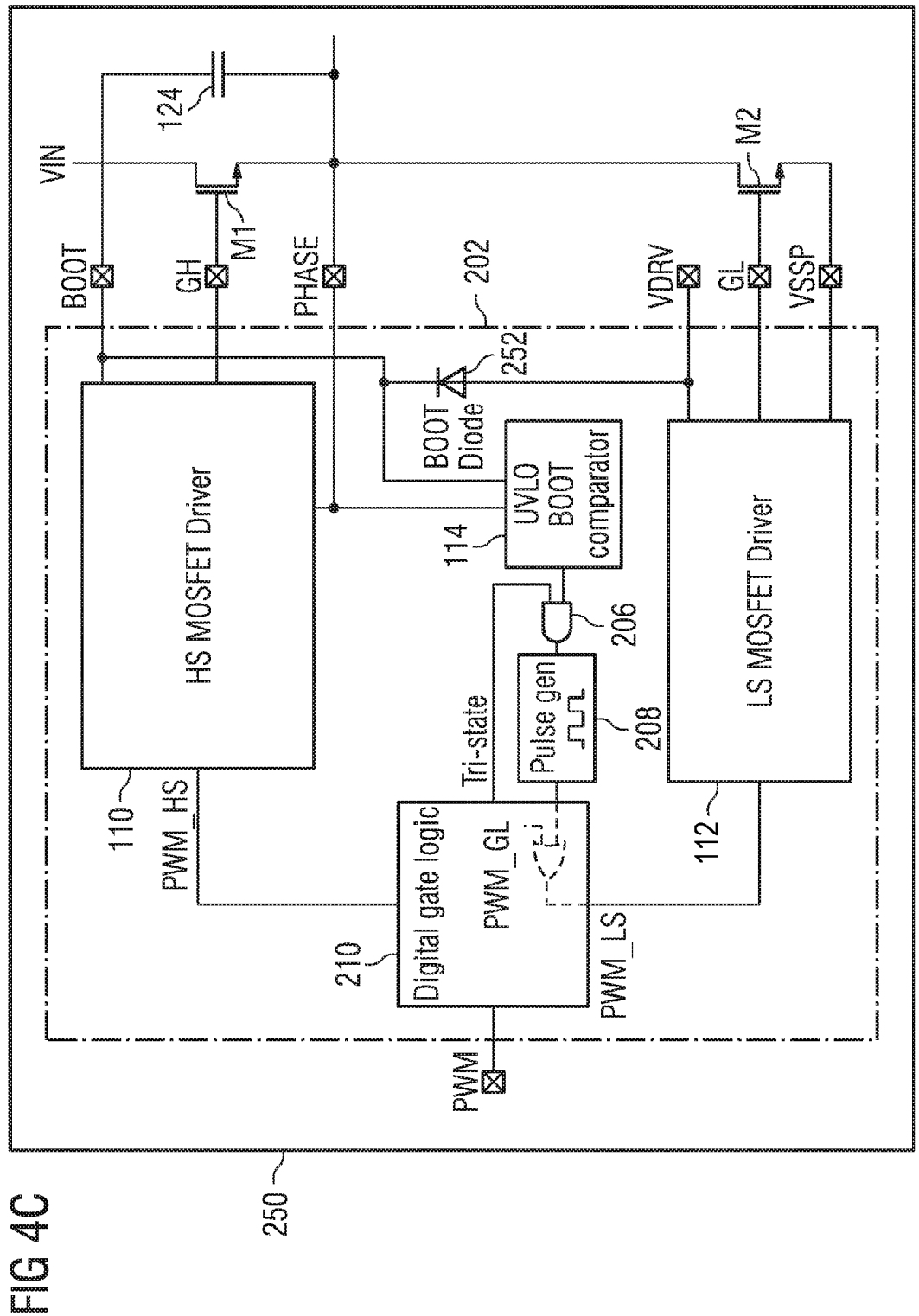
Figure 4D:
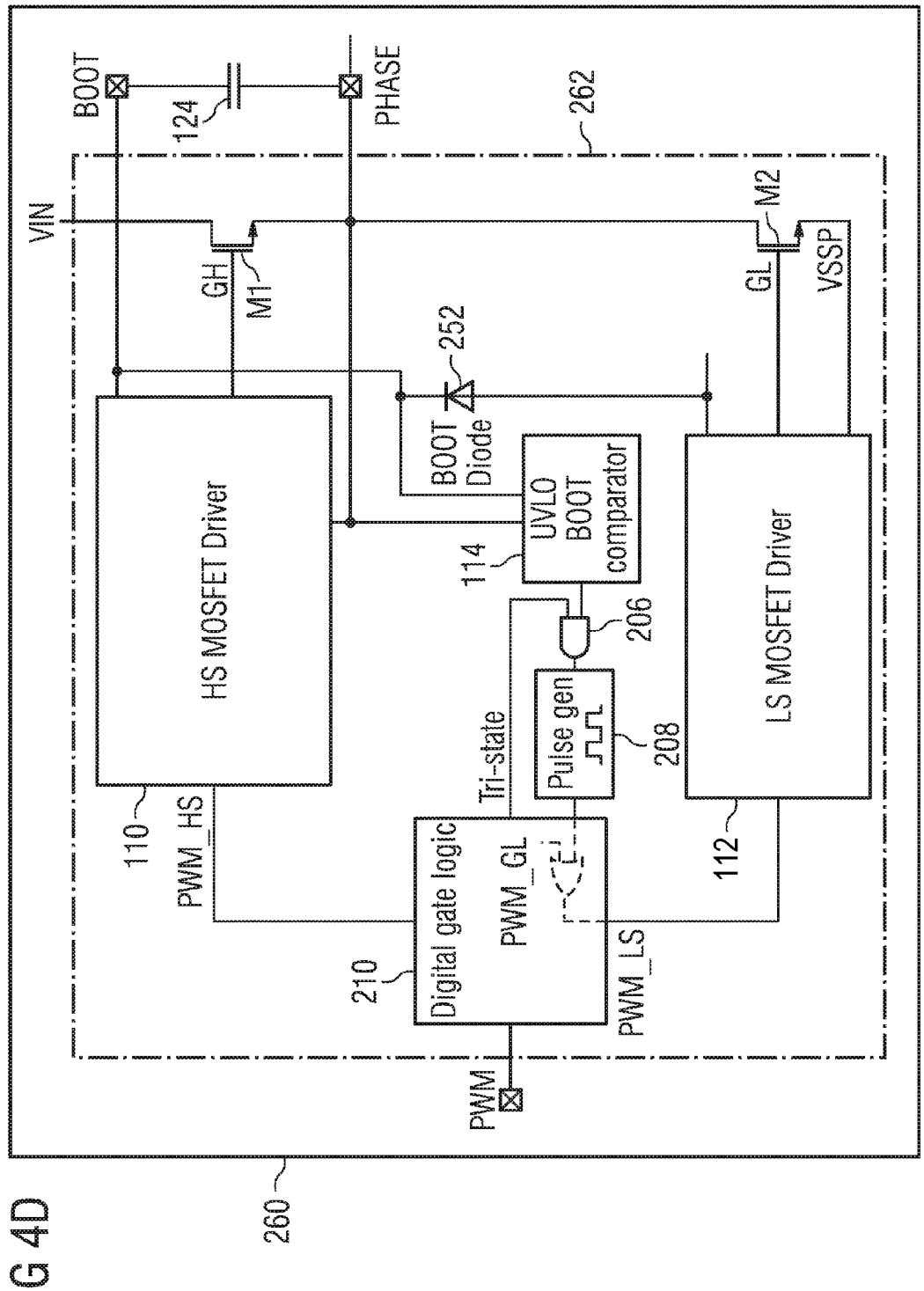

FIG. 4c illustrates switching system 250 according to another embodiment of the present invention. System 250 is similar to switching system 200 illustrated in FIG. 4a with boot switch 116 implemented as boot diode 252 coupled between supply voltage VDRV and node BOOT. FIG. 4d illustrates switching system 260 according to a further embodiment that also implements boot switch as boot diode 252. However, in switching system 260, switching transistors M1 and M2 are on the same integrated circuit as driving circuit 262.

Figure 5A:
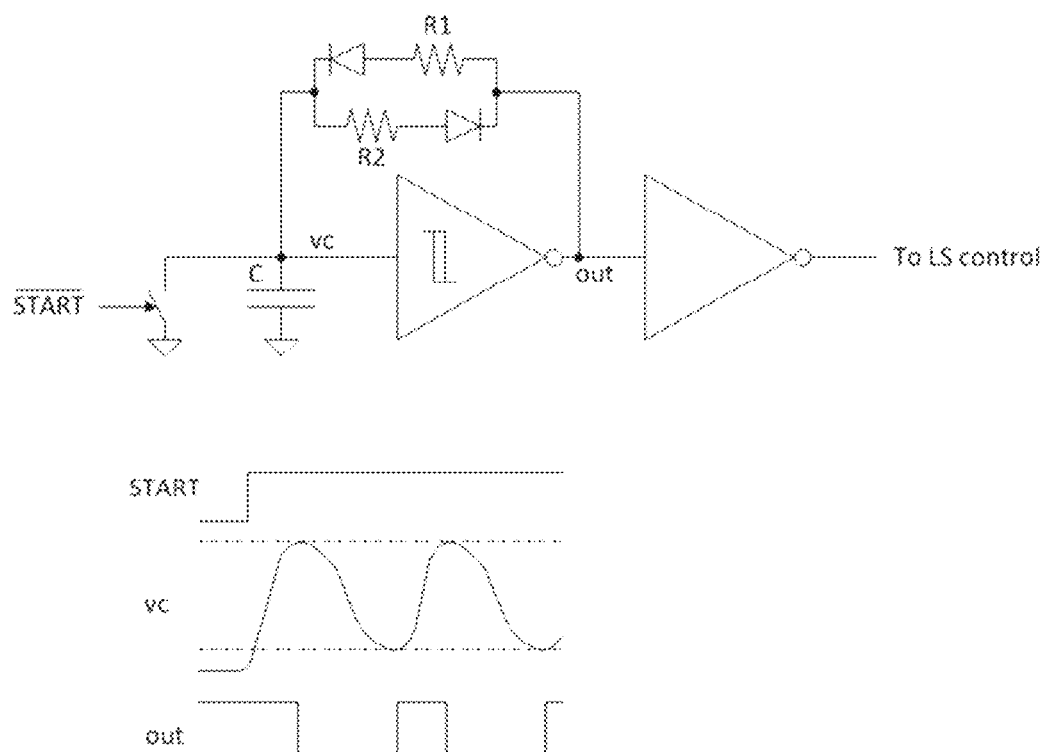
FIGS. 5a-5b illustrate embodiment pulse generation circuits.
Figure 5B:
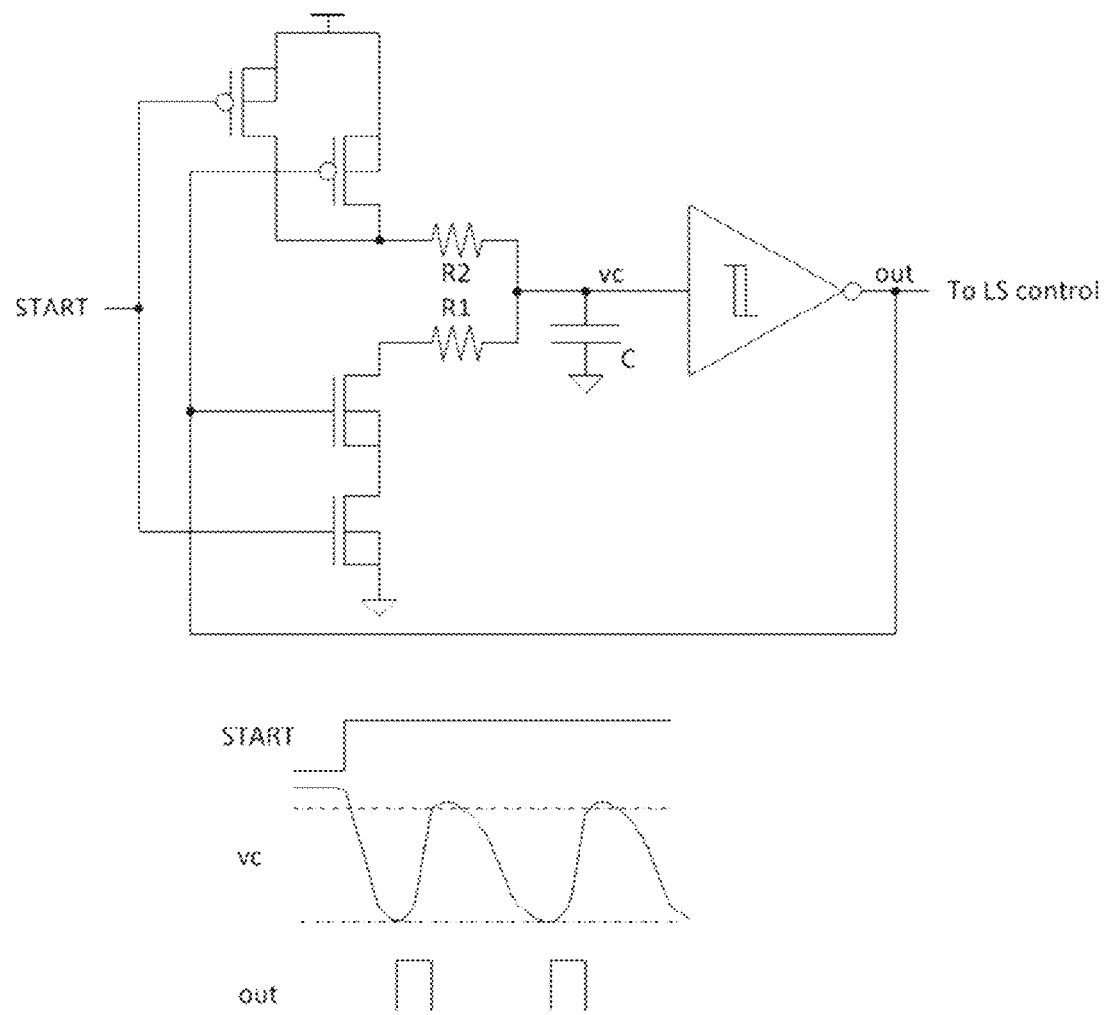

FIG. 5*a* illustrates a schematic of a pulse generation circuit that may be used to implement pulse generator 208 of FIGS. 4*a-c*. FIG. 5*b* illustrates a relaxation oscillator circuit that may also be used to implement pulse generator 208 of FIGS. 4*a-c*. It should be understood that the circuits of FIGS. 5*a* and 5*b* are just two specific examples of circuits that may be used to implement embodiment pulse generation circuits.

Figure 6:
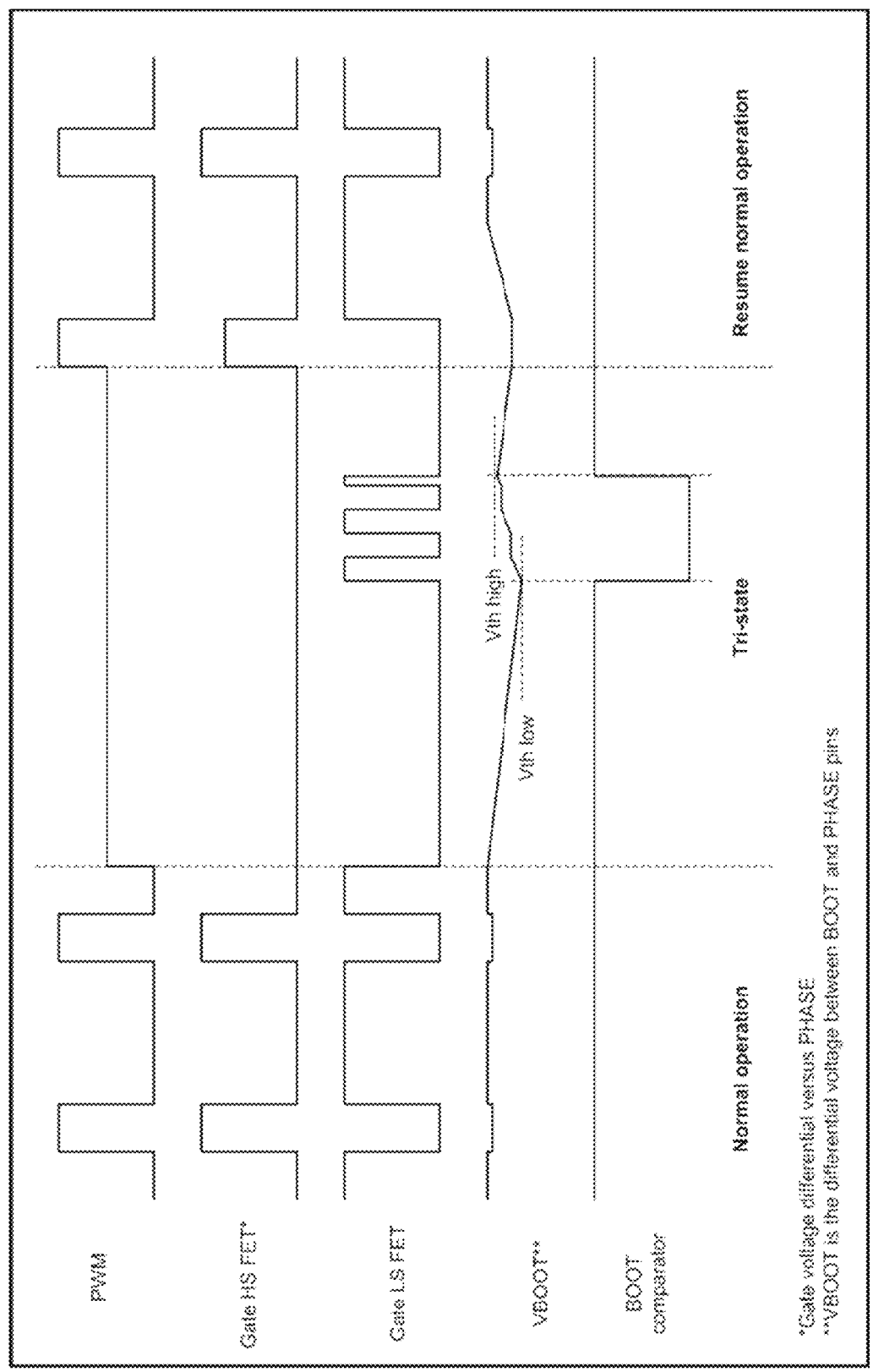
FIG. 6 illustrates a waveform diagram of an embodiment system.

FIG. 6 illustrates a waveform diagram showing the operation of an embodiment switching system during various phases of operation. Signal PWM is the PWM input signal, Gate HS FET is the gate-source voltage of the low-side switching transistor, Gate LS FET is the gate-source voltage of the low-side switching transistors, VBOOT is the differential voltage between the BOOT and PHASE pins (FIGS. 4*a-c*), and BOOT comparator is the output of comparator 114. As shown, during normal operation, signal Gate HS FET is high when signal PWM is high and signal Gate LS FET is high when signal PWM is low. VBOOT is shown having a voltage at about Vth high. During Tri-state mode, signal PWM is set into its Tri-state window (about one-half the corresponding logic "high" level voltage) to signal the switch drivers to tri-state its output. Alternative implementations may have a dedicated pin to disable the driver output. As such, both Gate HS FET and Gate LS FET are low. As BOOT drops below threshold Vth low, signal BOOT comparator goes low, and Gate LS FET is pulsed until VBOOT exceeds Vth high. Once signal PWM attains a high or low state, normal operation resumes.

Figure 7A:
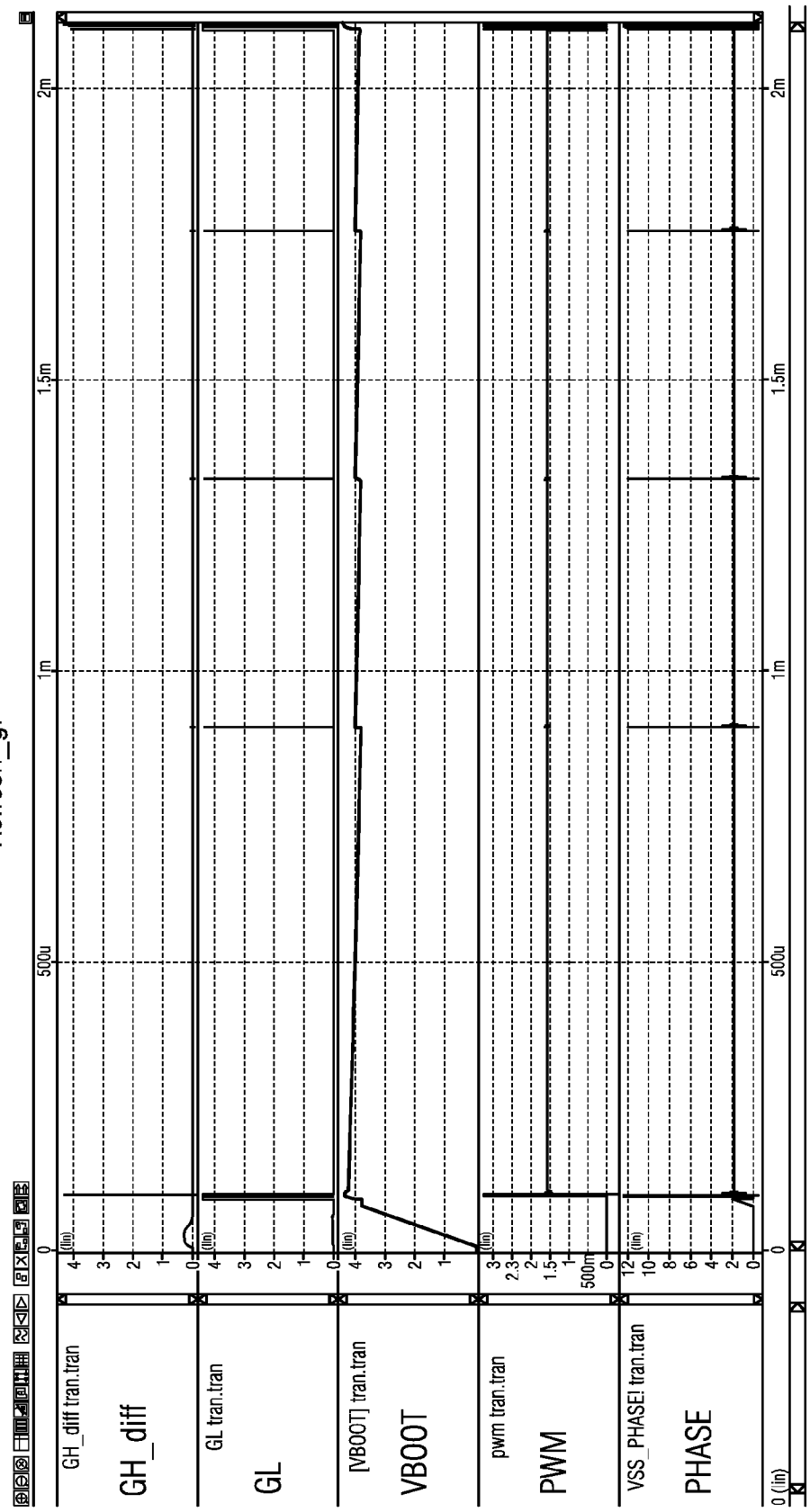

FIGS. 7*a-e* illustrate waveform diagrams of an embodiment switching system. GH_Diff represents the gate-source voltage of the high-side driver; GL represents the gate voltage of the low-side driver; VBOOT represents the voltage across the boot capacitor; PMW represents the PWM input signal and PHASE represents the output of the switches. In addition, signal BOOT_OK is a status signal that indicates whether or not the boot voltage is good. This signal goes low when the voltage across the boot capacitor falls below the threshold and the pulse refresh pattern had been activated to increase the voltage across the boot capacitor. When the voltage across the capacitor crosses the higher threshold, BOOT_OK goes high. It should be understood; however, that BOOT_OK, as well as other signals disclosed herein, may be implemented using active low logic signals or other logical representations known in the art. FIG. 7*a* illustrates a scenario in which the boot capacitor is periodically refreshed; FIG. 7*b* illustrates a scenario in which operation transitions from the tri-state mode to the normal mode; FIG. 7*c* illustrates a boot capacitor refresh scenario in the tri-state mode; FIG. 7*d* illustrates a scenario in which the operation of the system transitions from the performing a refresh in the tri-state mode to a high PWM pulse in normal operation mode; and FIG. 7*e* illustrates a scenario in which the operation of the system transitions from the performing a refresh in the tri-state mode to a low PWM pulse in normal operation mode. It should be understood that the waveform diagrams of FIGS. 7*a-e* are just a few of many examples of the operation of embodiment switching systems.

It should be further understood that while the examples here are directed toward boosting high-side drivers, the same method and techniques may also be applied to low-side drivers or drivers that are boosted with negative voltages.

In accordance with an embodiment, switch driver includes a first switch driver configured to be coupled to a control node of a first switch, a second driver configured to be coupled to a control node of a second switch, and a first terminal and a second terminal configured to be couple to a boot capacitor. The first terminal is coupled between a boot input of the first switch driver and the second terminal is configured to be coupled to outputs of the first switch and the second switch. The switch driver further includes a voltage measurement circuit coupled to the first terminal and the second terminal, and a control circuit configured to activate the second switch driver when the voltage measurement circuit indicates that a voltage across boot capacitor is below a first threshold.

In an embodiment, the first switch driver includes a high side driver, and the second switch driver includes a low side driver. The switch driver may further include the first switch and the second switch, such that the first switch is a high side switching transistor and the second switch is a low side switching transistor. In some embodiments, the high side switching transistor is a first n-channel MOSFET and the low side switching transistor is a second n-channel MOSFET.

In an embodiment, the control circuit is configured to activate the second switch driver by generating a series of pulses. In one embodiment, the first switch driver, the second switch driver, the voltage measurement circuit and the control circuit are disposed on a first integrated circuit. The switch driver may further include the first switch and the second switch, such that the first switch and the second switch are disposed on the first integrated circuit.

In various embodiments, the control circuit is further configured to deactivate the second switch driver when the voltage measurement circuit indicates that the voltage across the boot capacitor is above a second threshold. In some cases, the first threshold is different from the second threshold. The switch driver may partitioned such that the boot capacitor is further includes. In some embodiments, the control circuit is configured to activate the second switch driver by generating a series of pulses.

In accordance with a further embodiment, a switched mode power supply includes a high side driver coupled to a high side switching transistor, a low side driver coupled to a low side switching transistor, a boot capacitor having a first terminal coupled between a boot input of the high side driver and a second terminal coupled to outputs of high side switching transistor and low side switching transistor, a voltage measurement circuit coupled to the first terminal and the second terminal of the boot capacitor, and a control circuit configured to activate the low side driver when the voltage measurement circuit indicates that a voltage across boot capacitor is below a first threshold. The high side switching transistor may be implemented using a first n-channel MOSFET, and the low side switching transistor may be implemented using a second n-channel MOSFET.

In an embodiment, the control circuit includes a comparator having an input coupled to the boot capacitor, and a pulse generator comprising an input coupled to the output of the comparator and an output coupled to an input of the low side driver. The comparator may be configured to compare the voltage across the boot capacitor with the first threshold, and assert an output signal when the comparator detects that the voltage across the boot capacitor is less than the first threshold. The pulse generator may be configured to generate a series of pulses when the comparator asserts the output signal. In some embodiments, the comparator is configured to de-assert the output signal when the comparator detects that the voltage across the boot capacitor is greater than a second threshold.

In an embodiment, the switched mode power supply further includes an inductor having a first end coupled to the outputs of the high side switching transistor and low side switching transistor and a second end coupled to an output node of the switched mode power supply.

In accordance with a further embodiment, a method of operating a boosted switch coupled to an output of a first switch driver includes monitoring a voltage across a boot capacitor having a first terminal coupled to the first switch driver, the boot configured to provide a boot voltage to the first switch driver, and activating a second switch driver coupled to a second switch having an output node coupled to an output node of the first switch and coupled to a second terminal of the boot capacitor. The second switch driver is activated when a voltage across the boot capacitor is less than a first threshold, such that activating includes providing at least one pulse to the second switch driver.

In an embodiment, the method further includes deactivating the second switch driver when then the voltage across the boot capacitor is greater than a second threshold. In some cases, the second threshold is greater than the first threshold. In other cases, the second threshold may be less than the first threshold and/or equal to the first threshold.

Advantages of embodiments include the ability to ensure that boosted switch drivers are fully driven even after inactive time periods. By fully driving the boosted switch drivers, thermal loss through the switches may be reduced or avoided. By reducing such thermal losses, the reliability of the switches and other circuit components may be maintained. In addition, the converter is able to react quickly to sudden load changes without delay.

Embodiment switch signal generation systems and methods may also be applied to switch signal generation for multiphase power supply systems. For example, in some embodiments, boosted switches in multiphase power supply systems may utilize a boot capacitor and a measurement circuit to determine whether the voltage across each boot capacitor is sufficient to drive each respective switch in a low impedance states. Embodiment switch signal generation systems and methods may also be applied, for example, to the generation of switching signals for charge pumps.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A switch driver comprising:
a first switch driver configured to be coupled to a control node of a first switch;
a second switch driver configured to be coupled to a control node of a second switch;
a first terminal and a second terminal configured to be coupled to a boot capacitor, wherein the first terminal is coupled to a boot input of the first switch driver and the second terminal is configured to be coupled to outputs of the first switch and the second switch;
a voltage measurement circuit coupled to the first terminal and the second terminal, the voltage measurement circuit configured to measure a voltage across the boot capacitor; and
a control circuit coupled to the voltage measurement circuit and configured to activate the second switch driver when the voltage measurement circuit indicates that a voltage across boot capacitor is below a first threshold.

2. The switch driver of claim 1, wherein:
the first switch driver comprises a high side driver; and
the second switch driver comprises a low side driver.

3. The switch driver of claim 2, further comprising the first switch and the second switch, wherein the first switch comprises a high side switching transistor and the second switch comprises a low side switching transistor.

4. The switch driver of claim 3, wherein the high side switching transistor comprises a first n-channel MOSFET and the low side switching transistor comprises a second n-channel MOSFET.

5. The switch driver of claim 1, wherein the control circuit is configured to activate the second switch driver by generating a series of pulses.

6. The switch driver of claim 1, wherein the first switch driver, the second switch driver, the voltage measurement circuit and the control circuit are disposed on a first integrated circuit.

7. The switch driver of claim 6, further comprising the first switch and the second switch, wherein the first switch and the second switch are disposed on the first integrated circuit.

8. The switch driver of claim 1, wherein the control circuit is further configured to deactivate the second switch driver when the voltage measurement circuit indicates that the voltage across the boot capacitor is above a second threshold.

9. The switch driver of claim 8, wherein the first threshold is different from the second threshold.

10. The switch driver of claim 1, further comprising the boot capacitor.

11. The switch driver of claim 1, wherein the control circuit is configured to activate the second switch driver by generating a series of pulses.

12. The switch driver of claim 1, wherein the voltage measurement circuit comprises a comparator.

13. A switched mode power supply comprising:
a high side driver coupled to a high side switching transistor;
a low side driver coupled to a low side switching transistor;
a boot capacitor having a first terminal coupled to a boot input of the high side driver and a second terminal coupled to outputs of high side switching transistor and low side switching transistor;
a voltage measurement circuit coupled to the first terminal and the second terminal of the boot capacitor, the voltage measurement circuit configured to measure a voltage across the boot capacitor; and
a control circuit coupled to the voltage measurement circuit and configured to activate the low side driver when the voltage measurement circuit indicates that a voltage across boot capacitor is below a first threshold.

14. The switched mode power supply of claim 13, wherein:
the high side switching transistor comprises a first n-channel MOSFET; and
the low side switching transistor comprises a second n-channel MOSFET.

15. The switched mode power supply of claim 13, wherein:
the voltage measurement circuit comprises a comparator having an input coupled to the boot capacitor; and the control circuit comprises a pulse generator comprising an input coupled to the output of the comparator and an output coupled to an input of the low side driver.

16. The switched mode power supply of claim 15, wherein:
the comparator is configured to compare the voltage across the boot capacitor with the first threshold, and assert an output signal when the comparator detects that the voltage across the boot capacitor is less than the first threshold; and
the pulse generator is configured to generate a series of pulses when the comparator asserts the output signal.

17. The switched mode power supply of claim 16, wherein the comparator is configured to de-assert the output signal when the comparator detects that the voltage across the boot capacitor is greater than a second threshold.

18. The switched mode power supply of claim 13, further comprising an inductor having a first end coupled to the outputs of the high side switching transistor and low side switching transistor and a second end coupled to an output node of the switched mode power supply.

19. A method of operating a boosted switch coupled to an output of a first switch driver, the method comprising:
monitoring a voltage across a boot capacitor having a first terminal coupled to the first switch driver, the boot capacitor configured to provide a boot voltage to the first switch driver;
activating a second switch driver coupled to a second switch having an output node coupled to an output node of the first switch driver and coupled to a second terminal of the boot capacitor, wherein the second switch driver is activated when a voltage across the boot capacitor is less than a first threshold, and activating comprises providing at least one pulse to the second switch driver; and
deactivating the second switch driver when then the voltage across the boot capacitor is greater than a second threshold.

20. The method of claim 19, wherein the second threshold is greater than the first threshold.

* * * * *